United States Patent
Jang et al.

(10) Patent No.: US 7,550,764 B2
(45) Date of Patent: Jun. 23, 2009

(54) LIQUID CRYSTAL DISPLAY DEVICE AND METHOD OF FABRICATING THE SAME

(75) Inventors: Yong Ho Jang, Kyounggi-do (KR); Soo Young Yoon, Kyounggi-do (KR)

(73) Assignee: LG Display Co., Ltd., Seoul (KR)

( * ) Notice: Subject to any disclaimer, the term of this patent is extended or adjusted under 35 U.S.C. 154(b) by 128 days.

(21) Appl. No.: 10/876,619

(22) Filed: Jun. 28, 2004

(65) Prior Publication Data

US 2005/0041168 A1 Feb. 24, 2005

(30) Foreign Application Priority Data

Aug. 20, 2003 (KR) .................. 10-2003-0057518

(51) Int. Cl.
*H01L 31/00* (2006.01)
(52) U.S. Cl. .................. 257/57; 257/40; 257/E21.703; 349/43; 349/151
(58) Field of Classification Search .................. 257/57, 257/40, E21.703; 349/51, 151
See application file for complete search history.

(56) References Cited

U.S. PATENT DOCUMENTS

| | | | | |
|---|---|---|---|---|
| 5,071,779 | A | * | 12/1991 | Tanaka et al. ................ 438/158 |
| 5,247,375 | A | * | 9/1993 | Mochizuki et al. ............ 349/84 |
| 5,302,987 | A | * | 4/1994 | Kanemori et al. ............ 349/143 |
| 5,493,129 | A | * | 2/1996 | Matsuzaki et al. ............ 257/61 |
| 6,097,362 | A | * | 8/2000 | Kim ............................ 345/87 |
| 6,522,768 | B1 | | 2/2003 | Dekhil et al. |
| 6,906,385 | B2 | * | 6/2005 | Moon et al. .................. 257/347 |

FOREIGN PATENT DOCUMENTS

| | | |
|---|---|---|
| CN | 1420387 | 5/2003 |
| JP | 05-241216 | 9/1993 |
| JP | 5-341316 | 12/1993 |

\* cited by examiner

*Primary Examiner*—Howard Weiss
*Assistant Examiner*—John C Ingham
(74) *Attorney, Agent, or Firm*—McKenna Long & Aldridge LLP

(57) ABSTRACT

A liquid crystal display device includes a driving circuit provided with a switching device on a liquid crystal display panel, the switching device including a plurality of thin film transistors connected in parallel and commonly interconnected using a gate electrode.

5 Claims, 18 Drawing Sheets

LIQUID CRYSTAL DISPLAY DEVICE AND METHOD OF FABRICATING THE SAME

The present invention claims the benefit of Korean Patent Application No. P2003-57518, filed in Korea on Aug. 20, 2003, which is hereby incorporated by reference.

BACKGROUND OF THE INVENTION

1. Field of the Invention

The present invention relates to a display device and a method of fabricating a display device, and more particularly, to a liquid crystal display device and a method of fabricating a liquid crystal display device.

2. Description of the Related Art

In general, a liquid crystal display (LCD) device controls light transmittance of a liquid crystal material using an electric field to display images.

FIG. 1 is a schematic plan view of an LCD device according to the related art. In FIG. 1, an LCD device includes an LCD panel 5 having liquid crystal cells arranged in a matrix configuration, and a driving circuit 7 for driving the LCD panel 5.

Although not shown, gate lines and data lines are arranged to cross each other within the LCD panel 5. Each of the liquid crystal cells is positioned at each area where the gate lines cross the data lines. In addition, the LCD panel 5 is provided with a pixel electrode and a common electrode for applying an electric field to each of the liquid crystal cells. Each pixel electrode is connected, via source and drain electrodes of a thin film transistor (TFT), which functions as a switching device, to any one of the data lines. Similarly, the gate electrodes of the TFT are connected to any one of the gate lines, thereby allowing a pixel voltage signal to be supplied to the pixel electrodes for each of the data lines.

The TFT allows the pixel voltage signal to be charged in a corresponding pixel electrode in response to a gate high voltage Vgh transmitted along the gate lines. Accordingly, the liquid crystal cells charge the corresponding pixel voltage signals from the data lines when the TFT is turned ON due to the gate high voltage Vgh that is sequentially supplied along the gate lines, and any remaining charge is retained when the TFT is turned ON again. The pixel voltage signal is to be charged in the liquid crystal cell of a certain $n^{th}$-numbered gate line remaining due to a storage capacitor Cst (not shown) formed by an overlap of the pixel electrode and the gate line of a previous stage gate line.

In general, the gate high voltage Vgh is supplied to each of the gate lines for every frame only during a period of time that the gate line is driven, i.e., only during one horizontal period 1H allowing the pixel voltage signal charged in the pixel electrode, and a gate low voltage Vg1 is supplied during a rest period. The storage capacitor Cst remains charged with a voltage charged to the pixel electrode of a present stage gate line by the gate low voltage Vg1 supplied to the gate line of the previous stage gate line.

In FIG. 1, the driving circuit 17 includes a gate driver 27 for driving the gate lines, a data driver 17 for driving the data lines, a timing controller ~11 for controlling the gate driver 27 and the data driver 17, and a power supply (not shown) for supplying various driving voltages used in the LCD panel 5. The timing controller 11 controls driving timing of the gate driver 27 and the data driver 17, and supplies a pixel data signal to the data driver 17. The power supply generates driving voltages, such as the gate high voltage Vgh and the gate low voltage Vg1. The gate driver 27 sequentially supplies scanning signals to the gate lines to sequentially drive the liquid crystal cells on the LCD panel 5 on a one gate line-by-one gate line basis. The data driver 17 supplies data voltage signals to each of the data lines whenever the gate signal is supplied to any one of the gate lines. Accordingly, the LCD controls light transmittance by an electric field supplied between the pixel electrode and the common electrode in accordance with the pixel voltage signal for each liquid crystal cell, and thereby displays images.

The data driver 17 and the gate driver 27 are directly connected to the LCD panel 5, and are both integrated into a plurality of integrated circuits (IC's). In addition, each of the data drive ICs 15 and the gate drive ICs 25 are mounted in a tape carrier package (TCP) to be connected to the LCD panel 5 using a tape automated bonding (TAB) system, or mounted onto the LCD panel 5 by a chip on glass (COG) system.

In FIG. 1, the drive IC's 15 and 25 are connected, via the TCPs 13 and 23, to the LCD panel 5 by the TAB system, and are connected to each other and receive control signals and direct current voltage signals input from an exterior over signal lines mounted onto a printed circuit board (PCB) 31 and 33 connected to the TCPs 13 and 23. For example, the data drive IC's 25 are connected in series via signal lines mounted on a data PCB, and commonly receive control signals and pixel data signals from the timing controller 11 and driving voltages from the power supply. The gate drive IC's 25 are connected in series via signal lines mounted on the gate PCB 33, and commonly receive control signals from the timing controller and driving voltages from the power supply.

FIG. 2 is a schematic plan view of an LCD device having a gate driving circuit according to the related art. In FIG. 2, a gate driving circuit is mounted onto an LCD panel for manufacturing a thinner type LCD device, thereby reducing manufacturing costs.

FIG. 3 is a schematic plan view of an LCD device having a gate driving circuit and a data driving circuit according to the related art. In FIG. 3, an LCD panel includes a gate driving circuit, as well as a portion of a data driving circuit, formed on the LCD panel.

Switching devices have been proposed in the U.S. Pat. No. 6,522,768, which is hereby incorporated by reference in its entirety, that may be used in a driving circuit of an LCD device. Accordingly, although the switching devices, i.e., TFTs, have rapid response speeds, the TFTs are formed of amorphous silicon fabricated using simple processes and have relatively good uniformity rather than formed of polycrystalline silicon fabricated using more difficult processes, such as crystallizing a silicon layer using a laser beam.

FIG. 4 is a schematic plan view of a switching device for a driving circuit according to the related art. In FIG. 4, a switching device may be composed of a TFT that includes a gate electrode 56 connected to a gate line 52 formed on a lower substrate, a source electrode 60 connected to a source line 64, a drain electrode 72 connected to a drain line 73 arranging in opposition to the source electrode 60, and a semiconductor layer 68 forming a channel between the source electrode 60 and the drain electrode 72, and an insulating film (not shown). In addition, the semiconductor layer 68 has a stacked active layer configuration including the source electrode 60, the drain electrode 72, and an ohmic contact layer for providing ohmic contact between the source and drain electrodes 60 and 72 and the semiconductor layer 68.

In FIG. 4, the switching device has a relatively wide channel width W1 for switching relatively high voltages. For example, the switching device has the relatively wide channel width W1 contrary to a configuration in which a TFT is provided within a pixel region and configured to include a plurality of TFTs provided within a pixel region, which has been proposed in the Japanese Laid-Open Patent No. H5-341316. For instance, the channel width W1 of the TFT formed within the pixel region is within a range of several to several tens of micrometers, and the channel width of the driving circuit is within a range of several thousand to several tens of thousand of micrometers.

FIG. 5 is a graph demonstrating a relation between channel width and current variation according to the related art, and FIG. 6 is a graph demonstrating a relation between channel width and electric charge mobility according to the related art. In FIGS. 5 and 6, a current variation flowing within a channel of a switching device decreases, and an electric charge mobility also decreases depending on an increase of a channel width of the switching device.

For example, although the switching device has a relatively wide channel width for switching relatively high voltages, the decrease of the variation of the current flowing within the channel of the switching device is dependent upon the increase of the channel width of the switching device. Moreover, a current efficiency is decreased depending on the increase of the channel width, as shown in FIG. 5. Furthermore, since the current efficiency decreases depending on the increase of the channel width, the electric charge mobility decreases, thereby reducing response speed of the switching device.

In addition, when the switching device becomes damaged due to sparks created during fabricaton processes or as a result of overcurrents, switching characteristic of the switching device deteriorates, thereby providing abnormal driving characteristics.

SUMMARY OF THE INVENTION

Accordingly, the present invention is directed to an LCD device and method of fabricating an LCD device that substantially obviates one or more of the problems due to limitations and disadvantages of the related art.

An object of the present invention is to provide an LCD device including a driving circuit having an enhanced response speed.

Another object of the present invention is to provide a method of fabricating an LCD device including a driving circuit having an enhanced response speed.

Another object of the present invention is to provide an LCD device including a driving circuit having enhanced stablity.

Another object of the present invention is to provide a method of fabricating an LCD device including a driving circuit having enhanced stability.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a liquid crystal display device includes a driving circuit provided with a switching device on a liquid crystal display panel, the switching device including a plurality of thin film transistors connected in parallel and commonly interconnected using a gate electrode.

In another aspect, a method of fabricating a liquid crystal display includes forming a switching device on a liquid crystal display panel, the switching device having a plurality of amorphous thin film transistors connected in parallel, wherein the forming the switching device includes forming a gate electrode on a substrate, forming a plurality of source electrodes and a plurality of drain electrodes arranged to oppose each other with the gate electrode therebetween, and forming a semiconductor pattern including a plurality of channels between the source electrodes and the drain electrodes.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
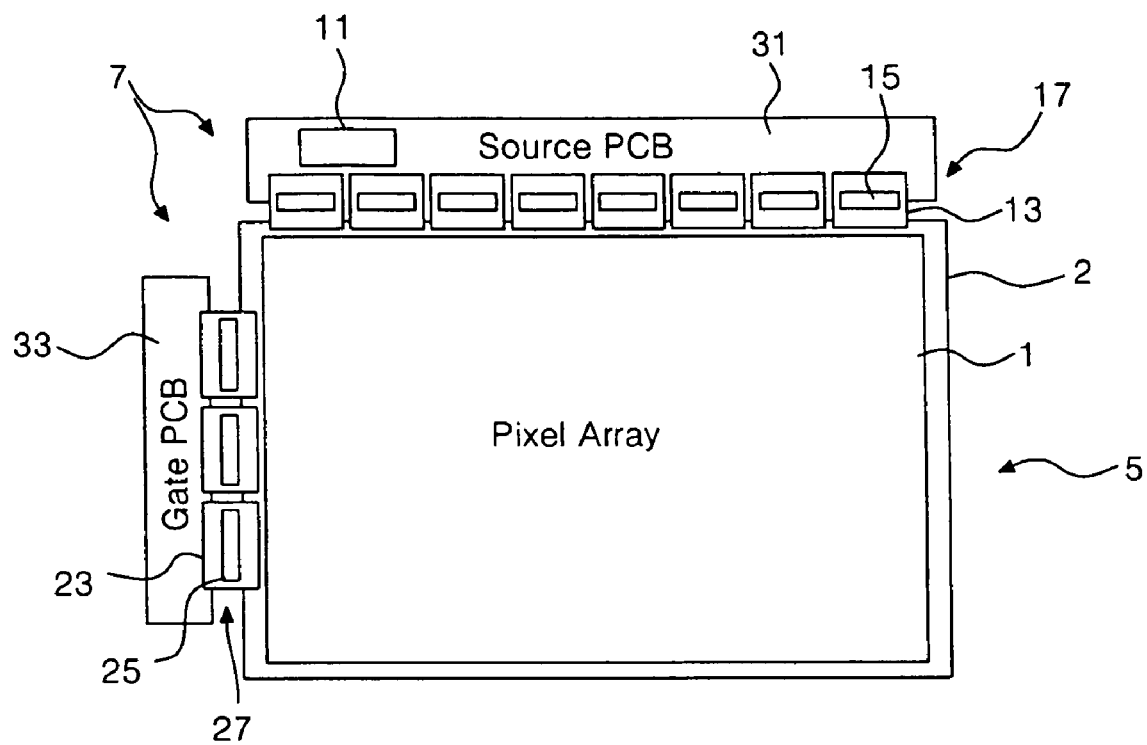
FIG. 1 is a schematic plan view of an LCD device according to the related art.
Figure 2:
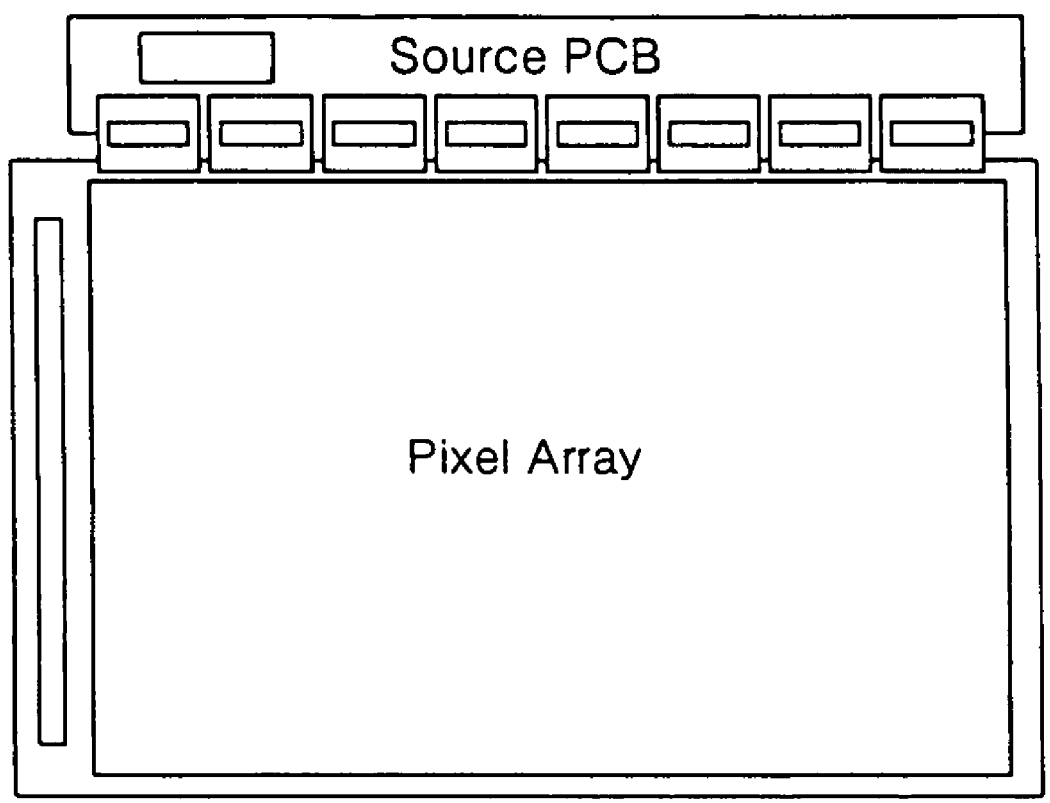
FIG. 2 is a schematic plan view of an LCD device having a gate driving circuit according to the related art.
Figure 3:
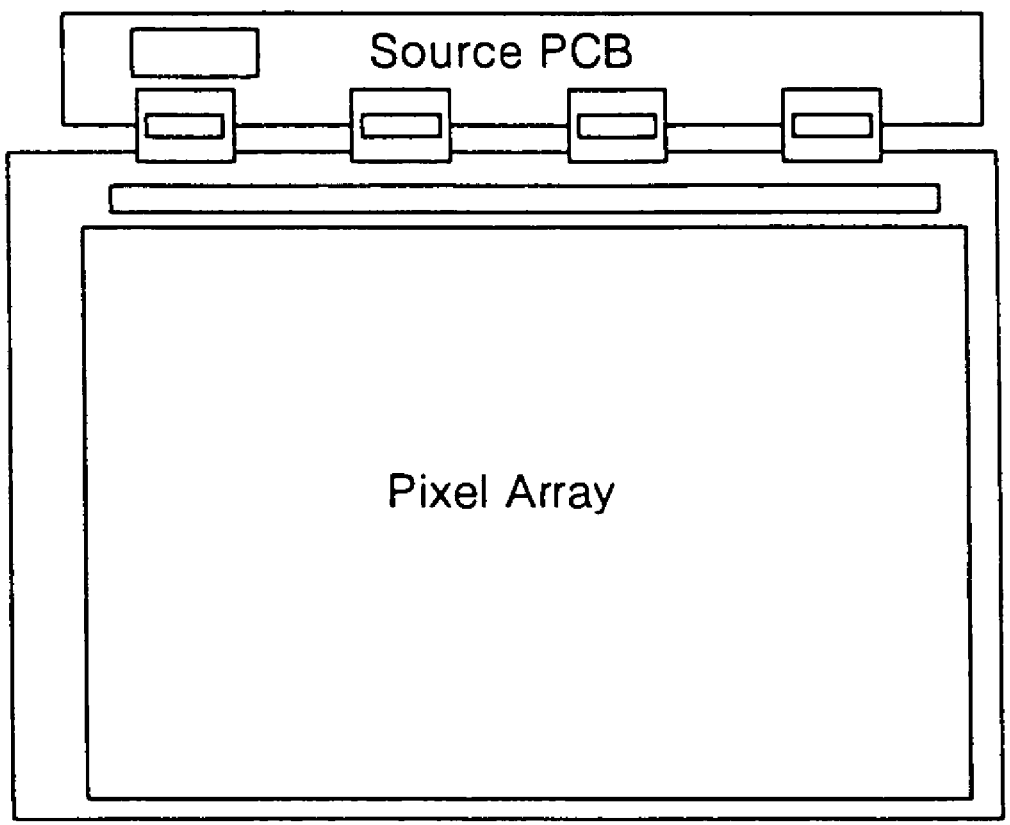
FIG. 3 is a schematic plan view of an LCD device having a gate driving circuit and a data driving circuit according to the related art.
Figure 4:
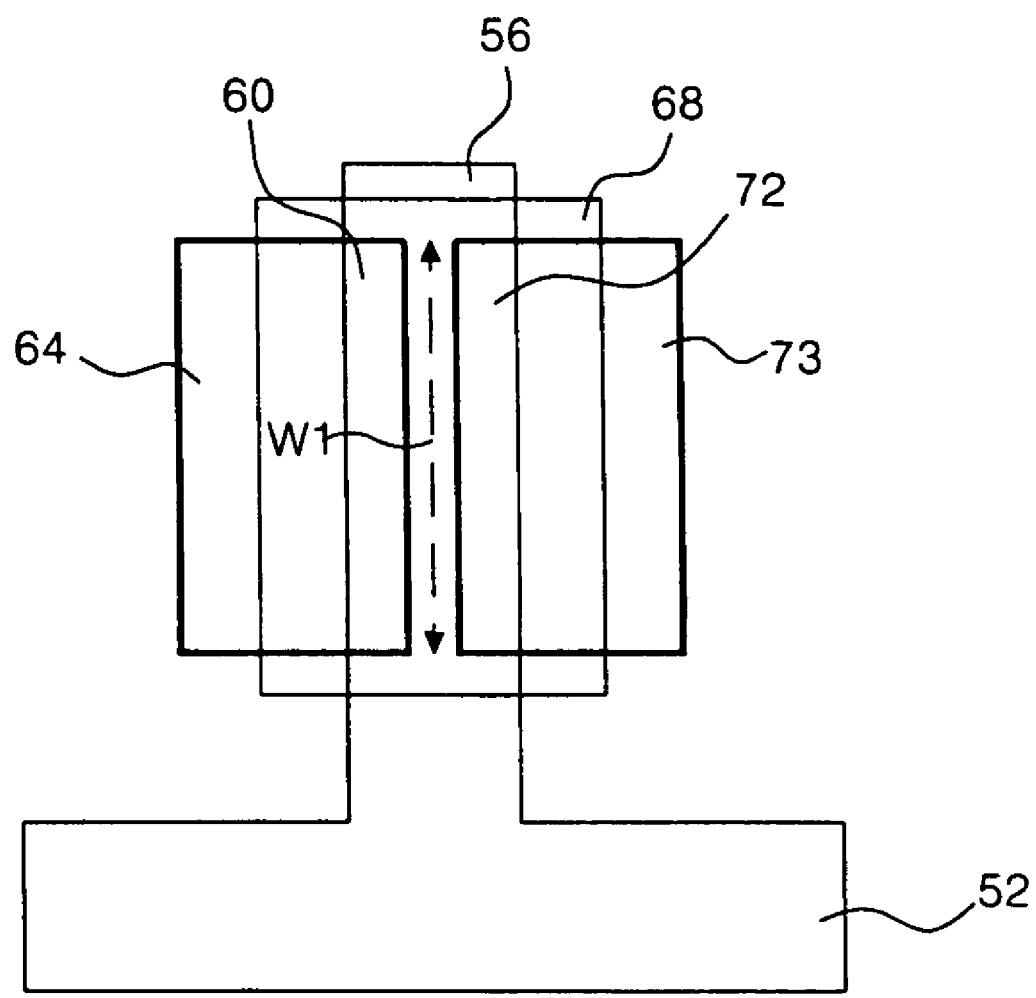
FIG. 4 is a schematic plan view of a switching device for a driving circuit according to the related art.
Figure 5:
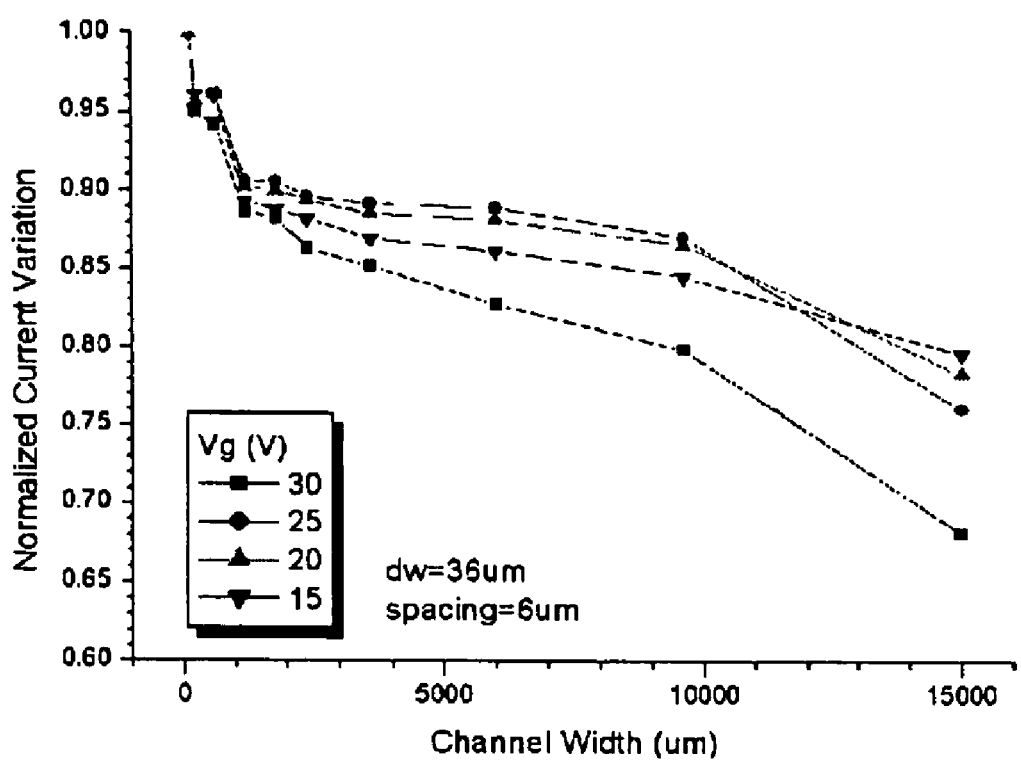
FIG. 5 is a graph demonstrating a relation between channel width and current variation according to the related art.
Figure 6:
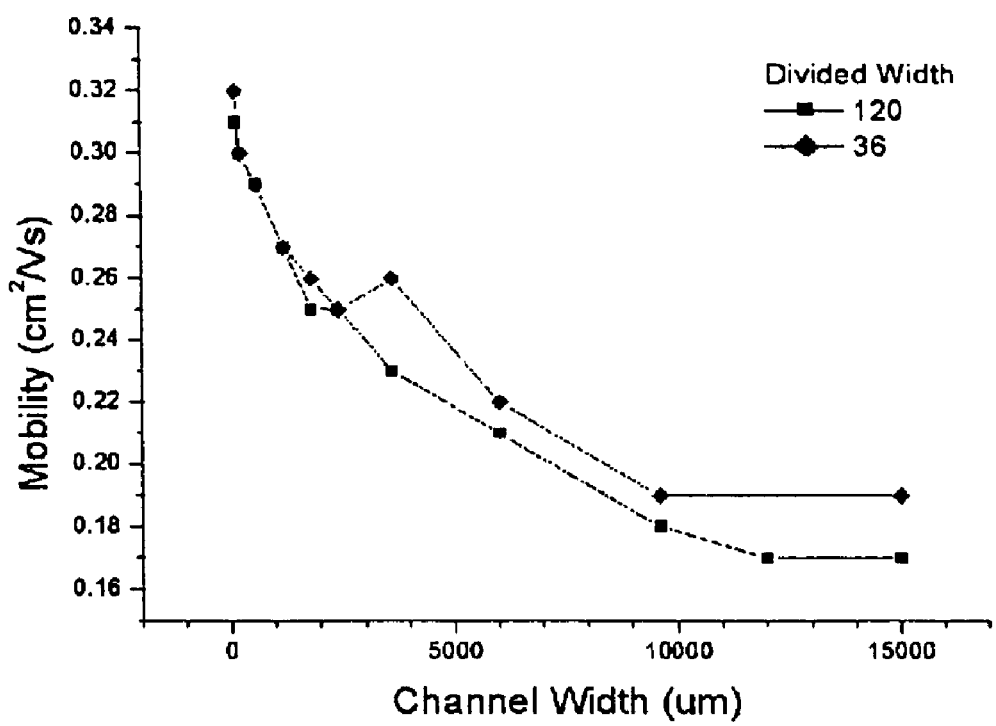
FIG. 6 is a graph demonstrating a relation between channel width and electric charge mobility according to the related art.
Figure 7:
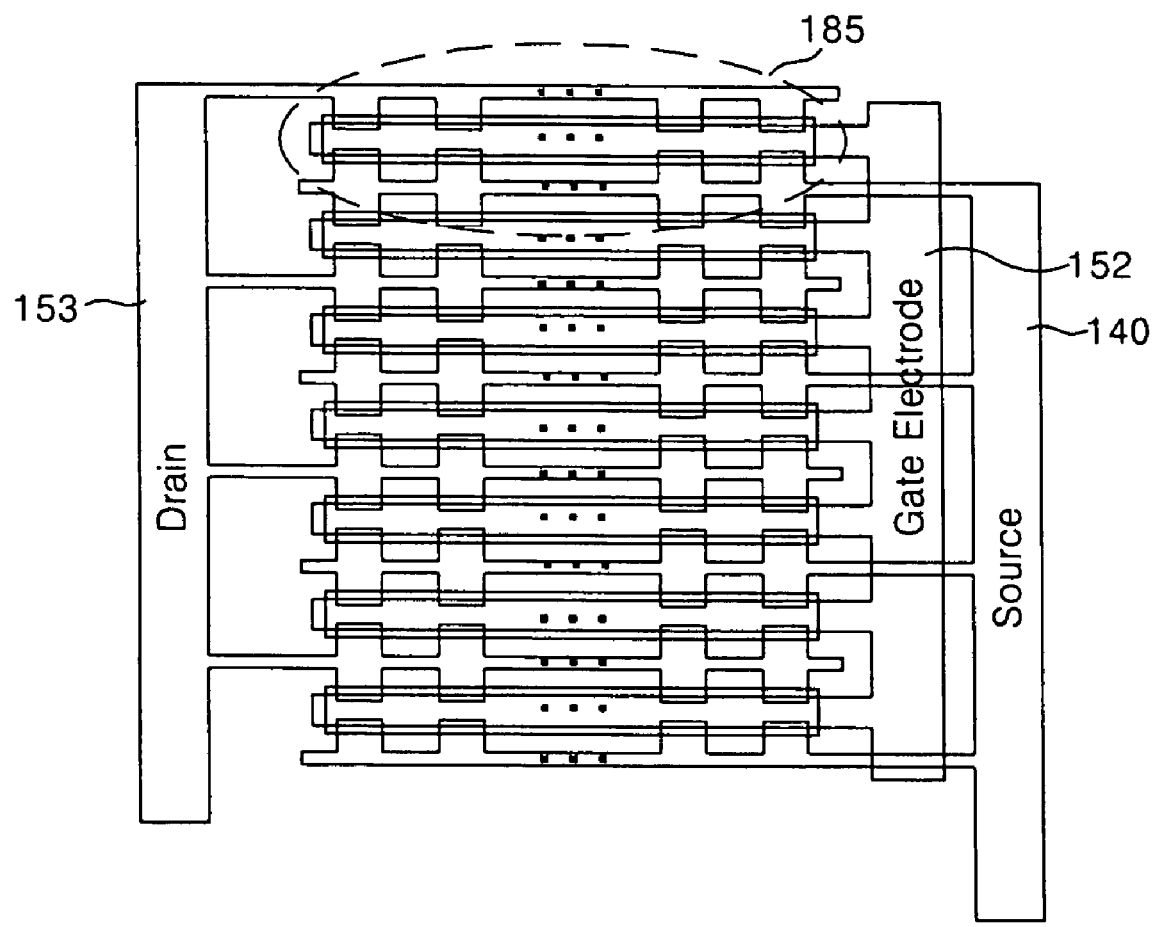
FIG. 7 is a schematic plan view of an exemplary driving circuit of an LCD device according to the present invention.
Figure 8:
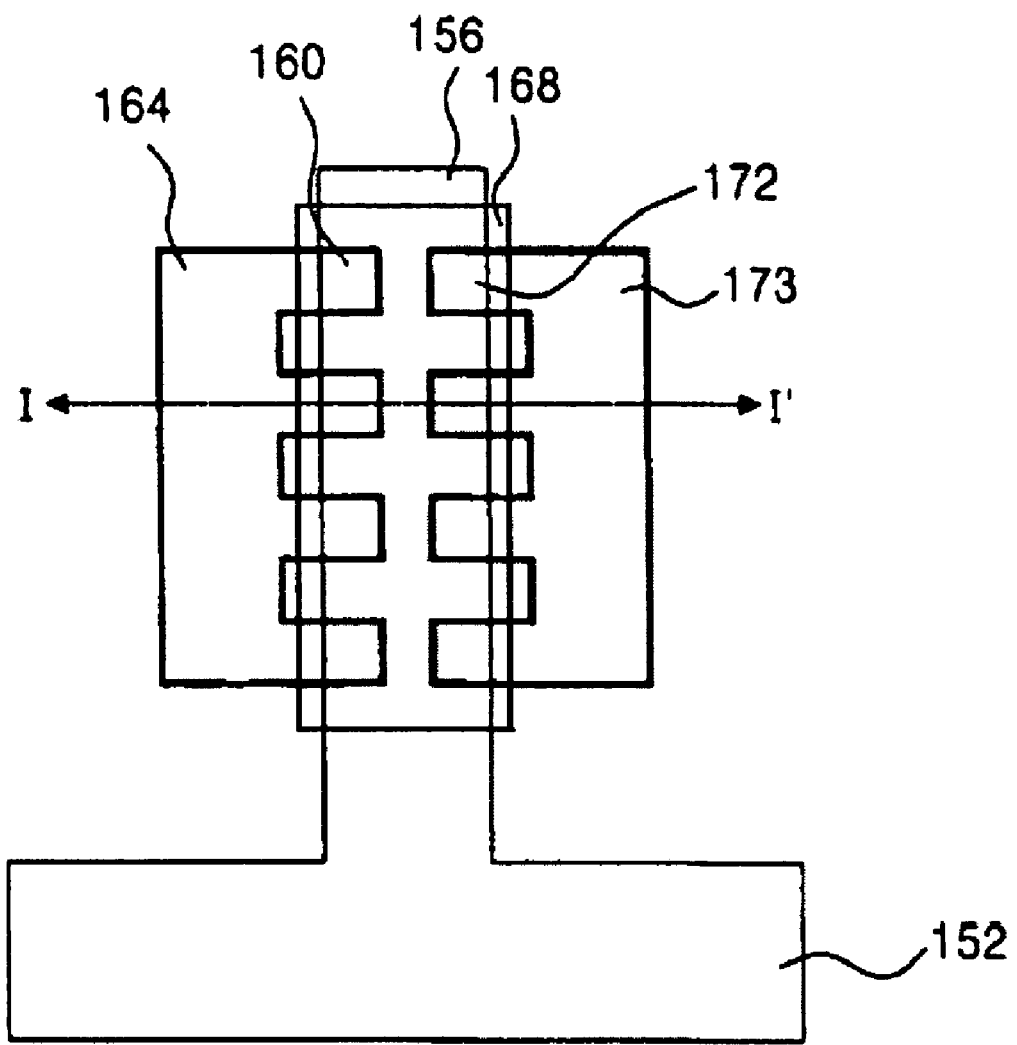
FIG. 8 is a schematic plan view of an exemplary switching of a driving circuit of an LCD device according to the present invention.
Figure 9:
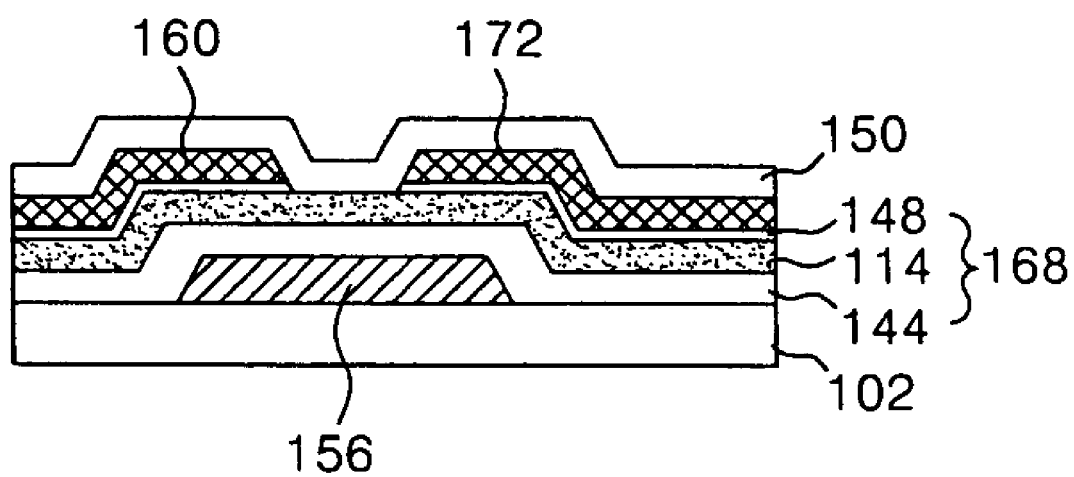
FIG. 9 is a cross sectional view along I-I' of FIG. 8 according to the present invention.

FIG. 7 is a schematic plan view of an exemplary driving circuit of an LCD device according to the present invention, FIG. 8 is a schematic plan view of an exemplary switching of a driving circuit of an LCD device according to the present invention, and FIG. 9 is a cross sectional view along I-I' of FIG. 8 according to the present invention. In FIG. 7, a driving circuit may include a gate line 152, a first drain line 153, and a source line 140 formed with the gate line 152 in a side-by-side configuration, and switching devices 185 having a plurality of TFTs may be connected in parallel.

In FIGS. 8 and 9, a switching device 185 may include a gate electrode 156 connected to the gate line 152 formed on a lower substrate 102, a plurality of source electrodes 160 commonly connected to a second source line 164 extending from a first source line 140, a plurality of drain electrodes 172 that face the source electrodes 160 and may be commonly connected to the second drain electrode 173 that extends from the first drain line 153, and a semiconductor layer 168 formed to overlap with the gate electrodes 156 with a gate insulating film disposed therebetween. Accordingly, the semiconductor layer 168 may include a plurality of channels formed between the source electrode 160 and the drain electrode 172. In addition, the semiconductor layer 168 may include an active layer 114 and an ohmic contact layer 148.

Accordingly, although one of the switching devices 185 may be damaged due to overcurrents flowing through any one of the TFTs and/or sparks created during fabrication processes, remaining ones of the switching device 185 may be normally driven. Thus, the switching device 185 formed in the driving circuit may have a configuration in which a plurality of TFTs may be electrically independent and mutually connected in parallel, thereby increasing stability of the switching devices 185.

Figure 10A:
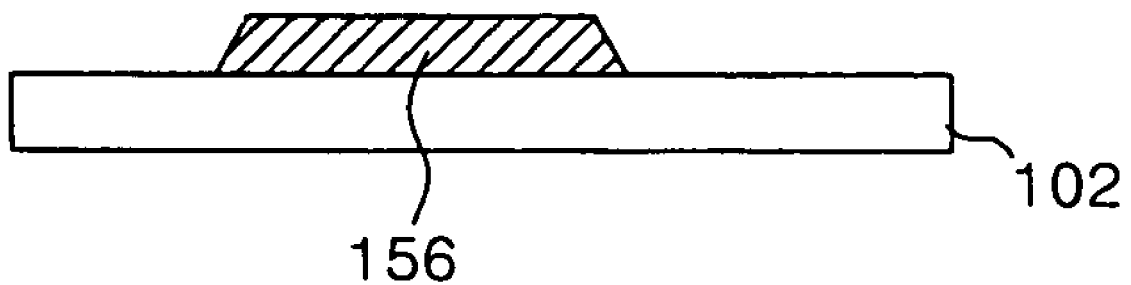
FIGS. 10A to 10D are cross sectional views of an exemplary method of fabricating the switching device of FIG. 9 according to the present invention.

FIGS. 10A to 10D are cross sectional views of an exemplary method of fabricating the switching device of FIG. 9 according to the present invention. In FIG. 10A, a gate metal layer may be deposited onto a lower substrate 102 by a sputtering method. Then, the gate metal layer may be patterned by photolithographic processes using an etching process including an etch mask, thereby forming a gate electrode 156 on the lower substrate 102. The gate metal may include chrome Cr, molybdenum Mo, or aluminum-based metals formed as a single layer or formed as a double layer configuration.

Figure 10B:
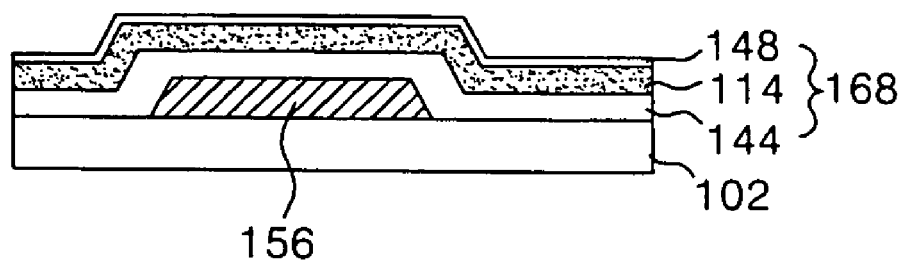

In FIG. 10B, a gate insulating film 144 may be formed along an entire surface of the lower substrate 102 having the gate electrode 156. The gate insulating film 144 may include an inorganic insulating material, such as silicon oxide SiOx or silicon nitride SiNx.

Then, an amorphous silicon layer and a N+ amorphous silicon layer may be sequentially formed on the lower substrate 102 having the gate insulating film 144 using a depositing method, such as PECVD and sputtering. Next, the amorphous silicon layer and the N+ amorphous silicon layer may be patterned by photolithographic processes and an etching process using a mask. Then, a semiconductor pattern 168 may be formed to have a number of narrow channel widths, wherein the semiconductor pattern 168 may have a double layer configuration comprising an active layer 114 and an ohmic contact layer 148.

Figure 10C:
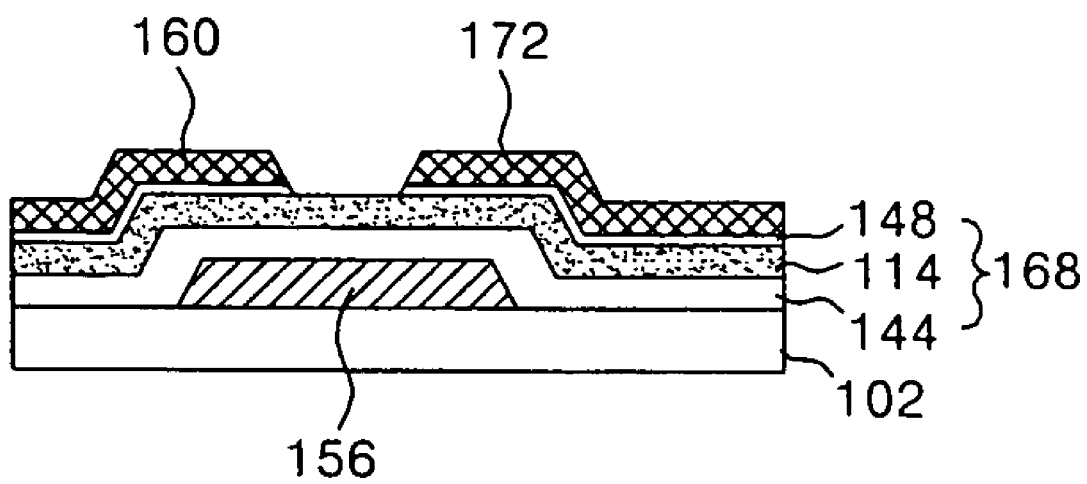

In FIG. 10C, a source/drain metal layer may be formed along the entire surface of the lower substrate 102 having the semiconductor pattern 168 by a depositing method, such as PECVD and sputtering. Next, a photoresist pattern may be formed on the source/drain metal layer by photolithographic processes using a mask. Then, the source/drain metal layer may be patterned by a wet etching process using the photoresist pattern. Accordingly, the source/drain patterns may be formed to include a plurality of source electrodes 160 and a plurality of drain electrodes 172 connected to a data line.

In FIG. 10C, the ohmic contact layer 148 corresponding to channel region may be removed by etching using the source electrode 160 and the drain electrode 172 as masks to expose the channel region of the active layer 114. A metal for forming the source/drain electrodes may include Mo, Ti, Ta, and Mo alloys.

Figure 10D:
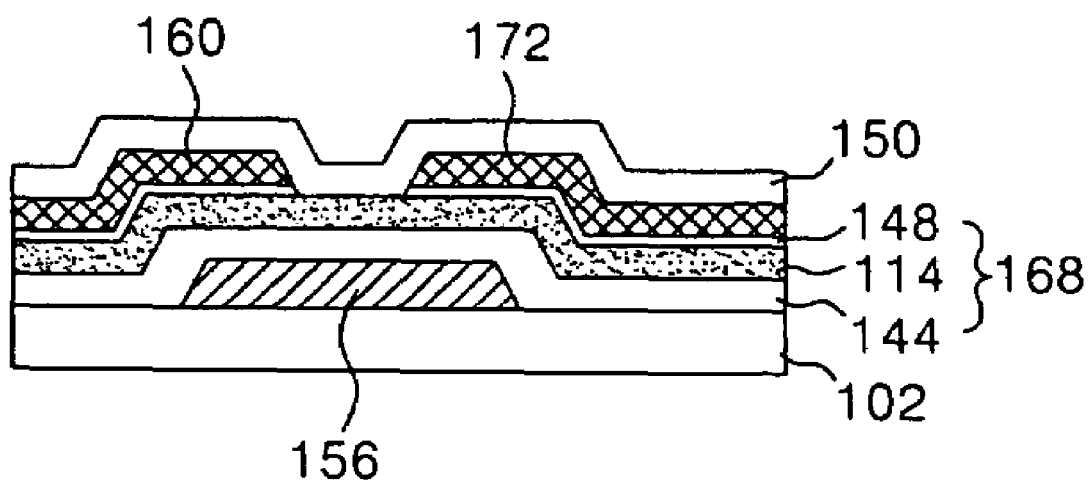

In FIG. 10D, a passivation layer 150 may be formed along the entire surface of the lower substrate 102 having the source/drain patterns using an etching method, such as PECVD.

Figure 11:
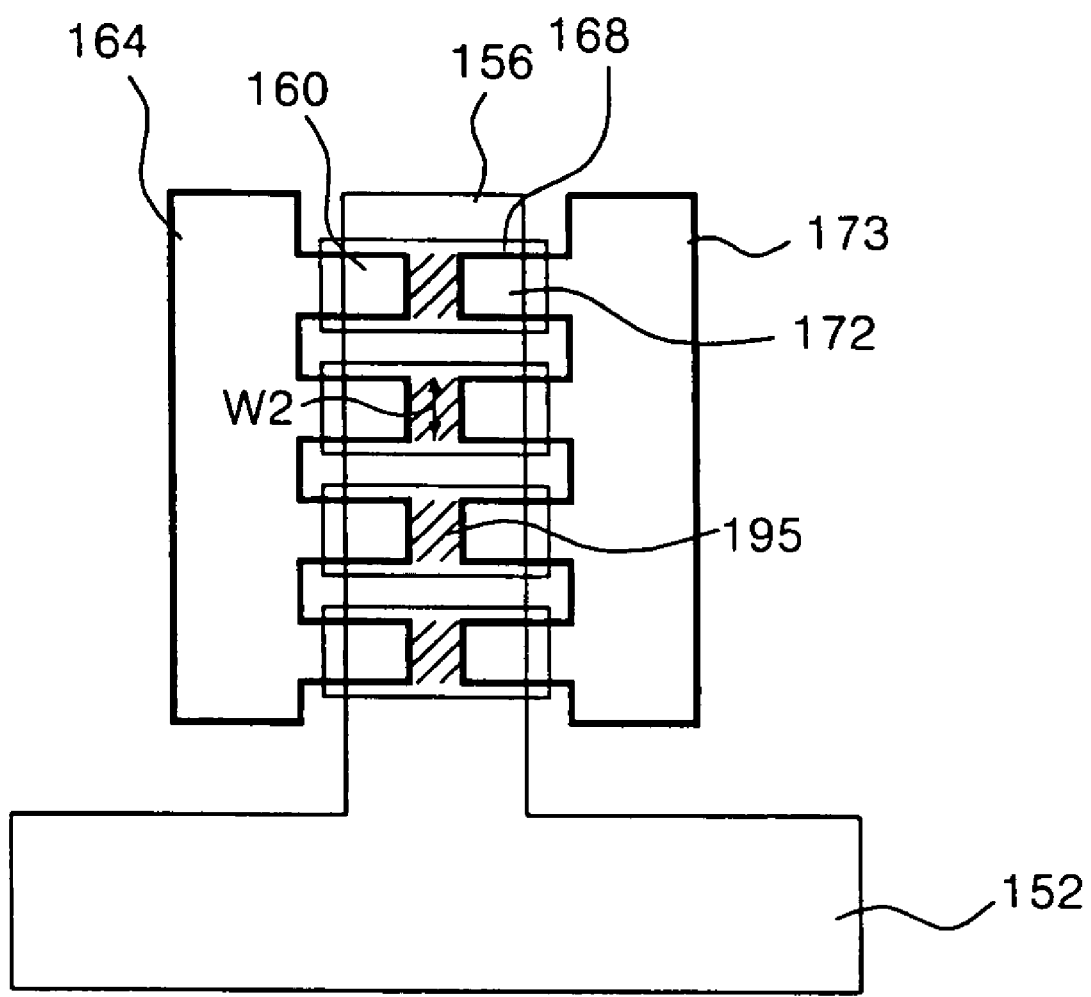
FIG. 11 is a schematic plan view of another exemplary switching device of a driving circuit of an LCD device according to the present invention.

FIG. 11 is a schematic plan view of another exemplary switching device of a driving circuit of an LCD device according to the present invention. Since the components shown in FIGS. 8 and 9 may be similar to the components shown in FIG. 11, explanation of the similar components has been omitted for the sake of brevity. However, similar components shown in FIG. 11 may have the same referenced number.

In FIG. 11, each of the semiconductor patterns of the switching device may be formed to have a channel between any one of a plurality of the source electrodes 160 and the drain electrode 172 arranged in opposition to the source electrode 160. For example, the semiconductor patterns may be formed such that the summation of the channel widths W2 of the respective semiconductor patterns 168 may be equal to a single channel width of a TFT. Accordingly, a TFT device may be formed having multiple channels having the channel width W2 formed in parallel with each other. Thus, benefits of a wide channel width TFT device may be achieved by a combination of each of the channel widths W2. Furthermore, since each of the channels 195 may be electrically separated from each other, each of the TFTs may not affect each other during operation. Since the deterioration of current efficiency reduced by widening of the channel widths W2, electric charge mobility may be increased, thereby enhancing response speed of the TFT device.

Figure 12:
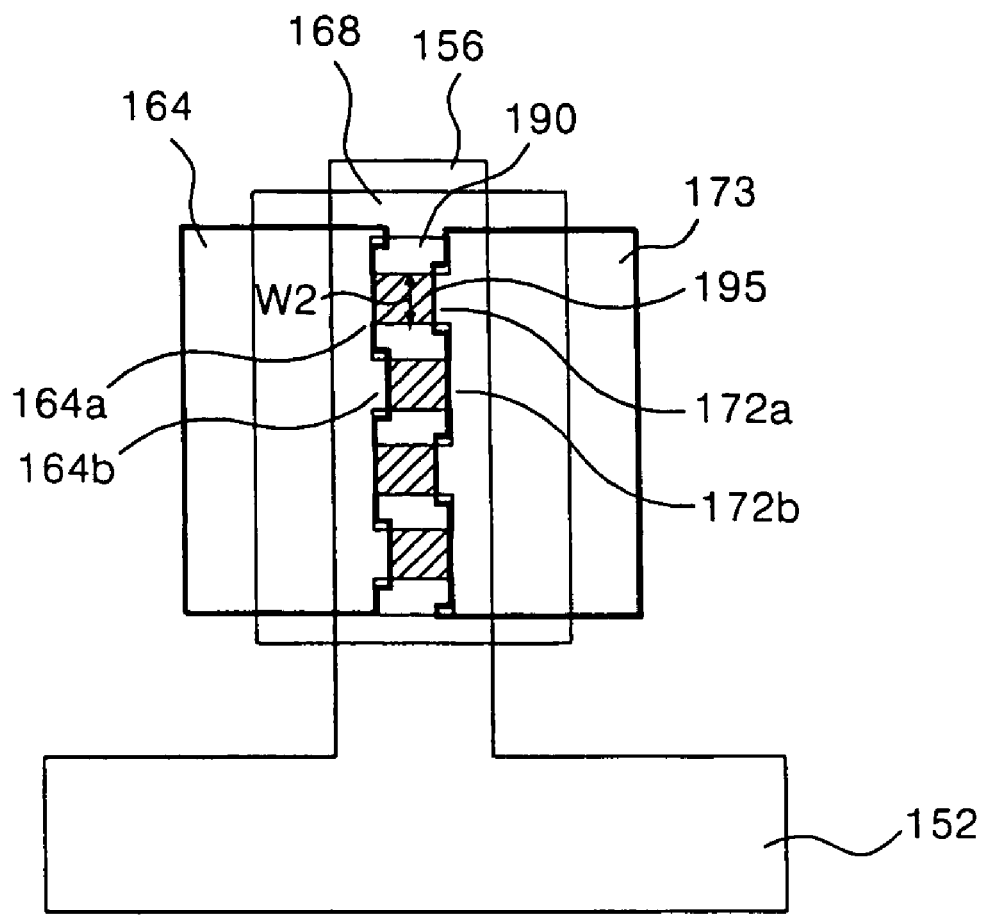
FIG. 12 is a schematic plan view of another exemplary switching device of a driving circuit of an LCD device according to the present invention.

FIG. 12 is a schematic plan view of another exemplary switching device of a driving circuit of an LCD device according to the present invention. The switching device of FIG. 12 may have similar components as those shown in FIG. 8, except for configurations of the source/drain electrodes. Accordingly, components similar to those shown in FIG. 8 may be given the same reference numerals, wherein detailed description therefore have been omitted.

In FIG. 12, a plurality of holes 190 may be formed within a semiconductor pattern 168, and a channel 195 may be formed at an area provided between the holes 190. In addition, the area between a second source line 164 and a drain line 173 may be formed to be relatively narrow, wherein the source electrodes 164 and 164 may be formed to have a concave-convex configuration and may both be commonly connected to the second source line 164. Similarly, the drain electrodes 172 and 172 may be formed to have a concave-convex configuration and may both be commonly connected to the second drain line 173. For example, the channels 195 may be formed between a convex portion of the source electrode 164 formed on the second source line 164 and a concave portion of the drain electrode 172 formed on the second drain line 173, and between a concave portion of the source electrode 16A formed on the second source line 164 and a convex portion of the drain electrode 172, respectively.

An effective channel width of the semiconductor pattern 168 may be formed as a summation of each of the channel width W2 of the plurality of narrow channels 195 formed on the semiconductor pattern 168. Accordingly, each of the switching devices in a driving circuit of an LCD panel may be electrically separated and connected in parallel. Thus, effects of a wide channel width may be obtained by adding each of the narrow channel widths W2. Furthermore, since each of the channels 195 may be electrically separated from each other, each of the TFTs may not affect each other during operation. Since deterioration of current efficiency may be reduced by widening of the channel widths, electric charge mobility may increase, thereby enhancing response speed. In addition, since each of the switching devices may be formed to be electrically independent from each other, damaged ones of the TFTs may not affect normal driving of an LCD panel. Moreover, since the space between the second source line 164 and the second drain line 173 is formed relatively narrow, an overall size of the switching device may be reduced, thereby reducing fabrication costs.

Figure 13:
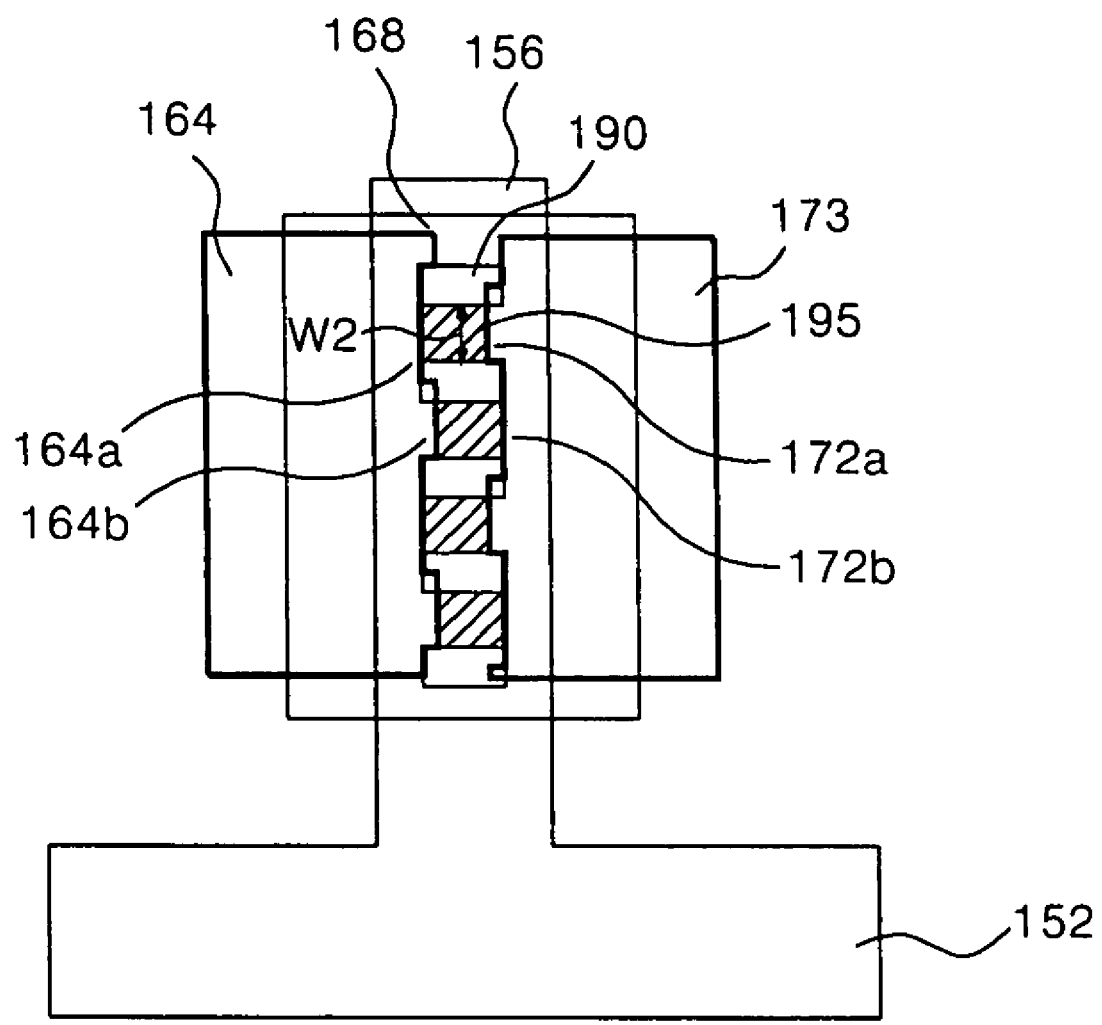
FIG. 13 is a schematic plan view of another exemplary switching device of a driving circuit of an LCD device according to the present invention.

FIG. 13 is a schematic plan view of another exemplary switching device of a driving circuit of an LCD device according to the present invention. In FIG. 13, a channel region may be formed between the source electrode 164 and the drain electrode 172, although the source and drain metal layers of the switching device may not be properly formed due to processing variations. In other words, since the channel may be formed between the source electrode and the drain electrode, although the source and drain electrodes may not be properly formed, the switching device may still be driven normally.

Figure 14:
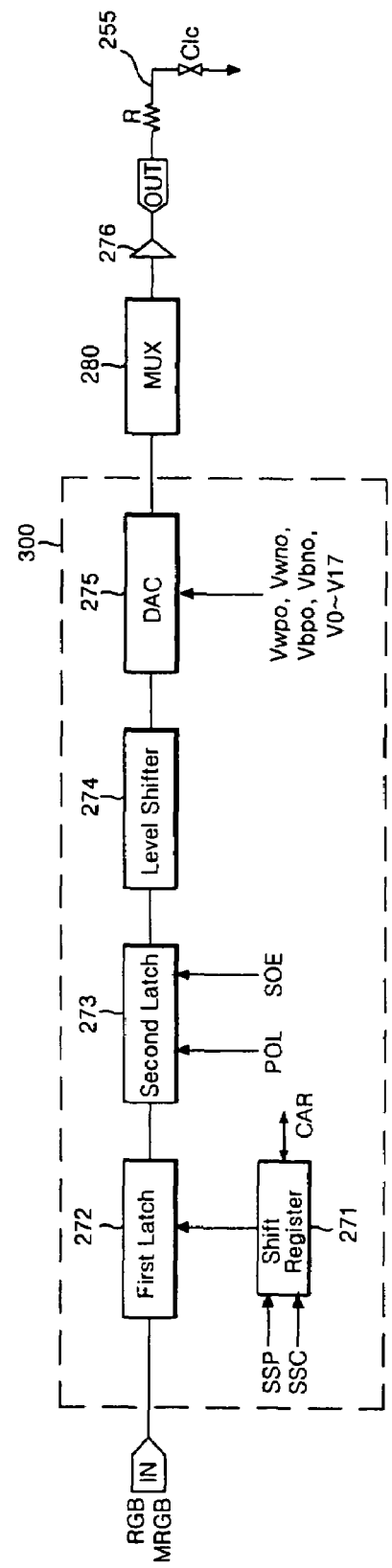
FIG. 14 is a block diagram of an exemplary data driving circuit according to the present invention.

FIG. 14 is a block diagram of an exemplary data driving circuit according to the present invention. In FIG. 14, a data driving circuit may include a data driving IC 300 including a shift register 271 for sampling a dot clock of a data control signal, first and second latches 272 and 273, which may be responsive to a clock signal from the shift register, for storing data on a line-by-line basis and simultaneously outputting the stored data on a line-by-line basis, a level shifter 274 for level-shifting a digital data voltage from the second latch 273, and a digital/analog converter 275 for selecting a positive/negative gamma voltage corresponding to the digital data. The data driving circuit also may include a multiplexer 280 for selecting a data line 255 to which an analogue data converted by the positive/negative gamma voltage is supplied, and an output buffer 276 connected between the multiplexer 208 and the data line 255.

Figure 15:
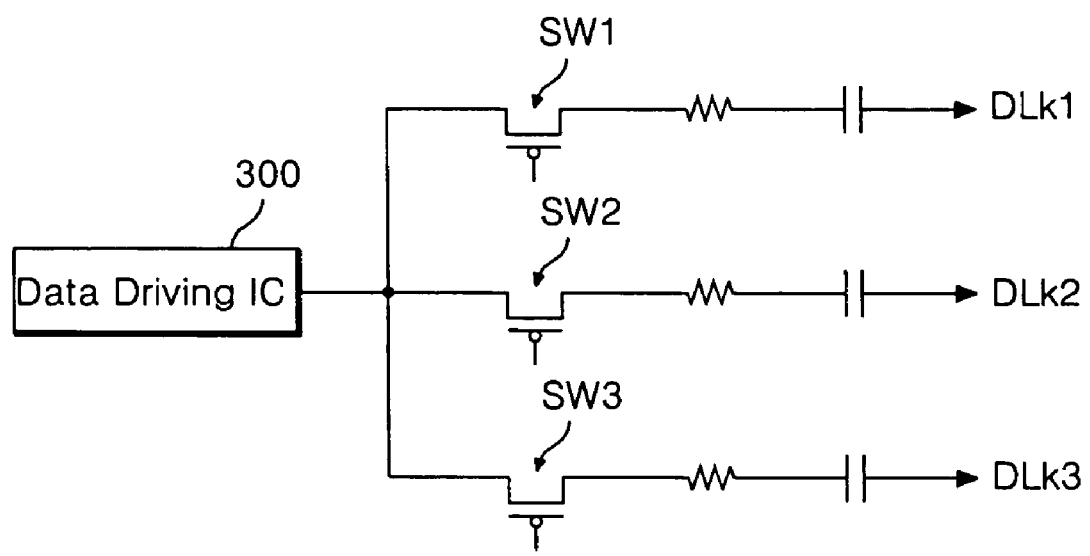
FIG. 15 is a schematic circuit diagram of an exemplary multiplexer of FIG. 14 according to the present invention.

FIG. 15 is a schematic circuit diagram of an exemplary multiplexer of FIG. 14 according to the present invention. In FIG. 15, each of the multiplexers 280 (in FIG. 14) may be connected to a plurality of data lines DLk1 to DLk3. Accordingly, each of the multiplexers 280 may sequentially supply video signals from the data driving IC 300 to the three data lines DLk1 to DLk3. Thus, each of the multiplexers 280 may include three switching devices SW1 to SW3 connected between the data driving IC 300 and the three data lines DLk1 to DLk3. In addition, switching devices included in each of the multiplexers 280 may be applicable to a configuration in which a plurality of TFTs, which may be electrically separated from each other, may be connected in parallel. For example, the exemplary switching devices shown in FIGS. 7-13 may be used as the switching devices SW1, SW2, and SW3 in FIG. 15. Alternatively, combinations of the exemplary switching devices shown in FIGS. 7-13 may be used as the switching devices SW1, SW2, and SW3 in FIG. 15. Furthermore, the exemplary switching devices shown in FIGS. 7-13 may be used as the switching devices of a gate driving part including shift registers.

It will be apparent to those skilled in the art that various modifications and variations can be made in the LCD device and method of fabricating an LCD device of the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
a liquid crystal display panel;
a pixel region and a driving circuit region;
a driving circuit on a liquid crystal display panel supplying a driving signal to the liquid crystal display panel; and
a switching device located in the driving circuit region and including a plurality of thin film transistor groups connected substantially in parallel with a gate line, a source line and a drain line,
wherein each thin film transistor group includes a plurality of thin film transistors connected substantially in parallel with a gate electrode branched from the gate line, a source electrode branched from the source line, and a drain electrode branched from the drain line,
wherein the plurality of thin film transistors include a single semiconductor pattern overlapping the gate electrode, the semiconductor pattern non-overlapping the gate line, the source line and the drain line, and being independently formed in the each thin film transistor group,
wherein the source electrode comprises alternately arranged convex-source portions and concave-source portions,
wherein the drain electrode comprises alternately arranged convex-drain portions opposite to the convex-source portions, and concave-drain portions opposite to the concave-source portions,
wherein the gate electrode and the semiconductor pattern overlaps only the convex-source portions and the convex-drain portions,
wherein the single semiconductor pattern includes channels respectively formed only between the convex-source portions and the convex-drain portions, the channels disconnected from each other through the single semiconductor pattern.

2. The device according to claim 1, wherein the switching device is formed on a multiplexer of a data driving region of the liquid crystal display panel.

3. The device according to claim 1, wherein the driving circuit includes a gate driving circuit.

4. A liquid crystal display device, comprising:
a liquid crystal display panel;
a pixel region and a driving circuit region;
a driving circuit on a liquid crystal display panel supplying a driving signal to the liquid crystal display panel; and
a switching device located in the driving circuit region and including a plurality of thin film transistor groups connected substantially in parallel with a gate line, a source line and a drain line,
wherein each thin film transistor group includes a plurality of thin film transistors connected substantially in parallel with a gate electrode branched from the gate line, a source electrode branched from the source line, and a drain electrode branched from the drain line,
wherein the plurality of thin film transistors include a plurality of semiconductor patterns, separated from each other, non-overlapping the gate line, the source line and the drain line,
wherein the source electrode comprises alternately arranged convex-source portions and concave-source portions,
wherein the drain electrode comprises alternately arranged convex-drain portions opposite to the convex-source portions, and concave-drain portions opposite to the concave-source portions, wherein the gate electrode and the semiconductor patterns overlaps only the convex-source portions and the convex-drain portions, wherein the semiconductor patterns respectively have channels formed only between the convex-source portions and the convex-drain portions, wherein each semiconductor pattern has a larger width than a width of each of the convex-source portions and the convex-drain portions, so that the channel width of the each semiconductor pattern is the same as the width of each of each of the convex-source portions and the convex-drain portions.

5. A liquid crystal display device, comprising:

a driving circuit provided with a switching device on a liquid crystal display panel, the switching device including a plurality of thin film transistor groups connected substantially in parallel with a gate line, a source line and a drain line, wherein each thin film transistor group includes a plurality of thin film transistors connected substantially in parallel with a gate electrode branched from the gate line, a source electrode branched from the source line, and a drain electrode branched from the drain line, wherein the plurality of thin film transistors include a single semiconductor pattern overlapping the gate electrode, the semiconductor pattern non-overlapping the gate line, the source line and the drain line, and being independently formed in the each thin film transistor group, wherein the source electrode comprises alternately arranged convex-source portions and concave-source portions, wherein the drain electrode comprises alternately arranged convex-drain portions opposite to the concave-source portions, and concave-drain portions opposite to the convex-source portions, wherein the single semiconductor pattern includes a plurality of narrow channels respectively formed between the concave-drain portions and the convex-source portions, and between the convex-drain portions and the concave-source portions, wherein a plurality of holes penetrating through the single semiconductor pattern in order for the narrow channels to be separated from the each other, so that the narrow channels are disconnected from each other through the single semiconductor pattern.

* * * * *